United States Patent
Campbell et al.

(10) Patent No.: US 12,400,942 B2
(45) Date of Patent: Aug. 26, 2025

(54) INTERPOSER FOR IMPLEMENTING FLIP-CHIP DIES IN WIREBONDED CIRCUIT ASSEMBLIES

(71) Applicant: BAE SYSTEMS Information and Electronic Systems Integration Inc., Nashua, NH (US)

(72) Inventors: Nicholas L. Campbell, Nashua, NH (US); Andrew M. Kraemer, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 122 days.

(21) Appl. No.: 18/313,526

(22) Filed: May 8, 2023

(65) Prior Publication Data
US 2024/0379518 A1  Nov. 14, 2024

(51) Int. Cl.
*H01L 23/498* (2006.01)
*H01L 21/56* (2006.01)
(Continued)

(52) U.S. Cl.
CPC ...... *H01L 23/49827* (2013.01); *H01L 21/563* (2013.01); *H01L 23/12* (2013.01);
(Continued)

(58) Field of Classification Search
CPC . H01L 23/49827; H01L 21/563; H01L 23/12; H01L 23/367; H01L 23/49506;
(Continued)

(56) References Cited

U.S. PATENT DOCUMENTS 6,501,157 B1 * 12/2002 Cobbley ............. H01L 23/5382
257/688
6,507,118 B1   1/2003 Schueller
(Continued)

FOREIGN PATENT DOCUMENTS

EP    1137067 A3    9/2007

OTHER PUBLICATIONS

International Search Report, PCT/US24/27975, mailed Aug. 27, 2024, 8 pages.

*Primary Examiner* — Zandra V Smith
*Assistant Examiner* — Corbyn D Mellinger
(74) *Attorney, Agent, or Firm* — Maine Cernota & Curran; Gary McFaline

(57) ABSTRACT

An interposer that enables implementation of a flip-chip die in a wirebonded chip-and-wire circuit assembly includes an insulating substrate having a solder bump pad array on its upper surface that is compatible with the solder bump array of a flip-chip die. Wirebond pads provided along upper edges of the substrate are interconnected to at least some of the solder bump pads. Bonding the interposer to the circuit assembly housing floor, or through an opening to an underlying motherboard, places the wirebond pads proximate attachment points of adjacent wirebond dies, enabling wirebonding therebetween. Attachment pads on the interposer lower surface, in combination with interconnecting traces and vias, can enable connection directly through the housing opening to the underlying motherboard. Support components can be included within an edge cavity created beneath an overhang of a multi-layer substrate. A heat absorbing plate can be attached to the top of the flip-chip die.

12 Claims, 9 Drawing Sheets

(51) Int. Cl.
*H01L 23/12* (2006.01)
*H01L 23/367* (2006.01)
*H01L 23/495* (2006.01)
*H05K 1/18* (2006.01)

(52) U.S. Cl.
CPC ...... *H01L 23/367* (2013.01); *H01L 23/49506* (2013.01); *H01L 23/4952* (2013.01); *H01L 23/49816* (2013.01); *H05K 1/181* (2013.01)

(58) Field of Classification Search
CPC .......... H01L 23/4952; H01L 23/49816; H05K 1/181
See application file for complete search history.

(56) References Cited

U.S. PATENT DOCUMENTS

| | | |
|---|---|---|
| 6,853,058 B2 | 2/2005 | Cobbley |
| 7,423,338 B2 | 9/2008 | Wark |
| 7,554,185 B2 | 6/2009 | Foong |
| 7,629,686 B2 | 12/2009 | Kinsman |
| 9,129,826 B2 | 9/2015 | Lee |
| 9,842,820 B1 | 12/2017 | Shen |
| 2005/0056944 A1 | 3/2005 | Pendse |
| 2005/0212107 A1* | 9/2005 | Kato ............... H01L 25/165 |
| | | 257/E25.031 |
| 2008/0036096 A1 | 2/2008 | Kamezos |
| 2010/0327424 A1 | 12/2010 | Braunisch |
| 2011/0260320 A1 | 10/2011 | Kubota et al. |
| 2012/0199960 A1 | 8/2012 | Cosue |
| 2017/0076979 A1 | 3/2017 | Hollis |
| 2019/0267306 A1* | 8/2019 | Raravikar ............ H01L 23/42 |
| 2021/0407942 A1 | 12/2021 | Yu et al. |
| 2022/0254707 A1 | 8/2022 | Chen |

* cited by examiner

INTERPOSER FOR IMPLEMENTING FLIP-CHIP DIES IN WIREBONDED CIRCUIT ASSEMBLIES

FIELD

The disclosure relates to integrated circuit assemblies, and more particularly to circuit assemblies that directly incorporate a plurality of interconnected IC dies.

BACKGROUND

The fundamentals of integrated circuit production are well known. To summarize, a large number of integrated circuits are formed on a semiconductor "wafer", which is then cut into individual integrated circuits or "dies." In most cases, each of the dies is mounted in a "package," which surrounds and encloses the die and provides pins or pads (generically referred to herein as "pads") that can be surface mounted by wave soldering, or otherwise electrically attached by soldering or by some other means to a printed circuit board, referred to herein as a "motherboard."

One of the most common methods of connecting the very tiny interconnection points of a die with the pads provided by its package is "wirebonding," whereby fine wires are "ball-welded" or otherwise welded at their distal ends to the die interconnection points, and then "wedge welded" or otherwise welded at their proximal ends to the pads of the package. This approach generally requires that the interconnection points of the die must be located about the perimeter of the die. A requirement for more connection points can therefore require that the perimeter of the die be enlarged, even if a larger footprint is not necessary to accommodate the die circuit itself.

For applications that require high density circuit assemblies, either for limited space applications such as in satellites, and/or applications such as microwave circuits that require very high signaling rates, this wirebonding technology can be extended to provide direct interconnections between dies, thereby eliminating the need for die packages. With reference to FIGS. 1A and 1B, one approach to providing a high-density circuit assembly 102 is generally referred to as "chip-and-wire." According to this approach, a plurality of dies 104, 106 are arranged in a nearly abutting relationship and the "back" sides of the dies, i.e. the sides of the dies that are furthest from the interconnection points, are directly epoxied or otherwise bonded to an underlying surface 100 without die packaging. Typically, the "underlying surface" 100 is the floor of a metal housing that encloses the circuit assembly, or another metal surface that is in thermal communication with the housing. Accordingly, this underlying surface 100 is referred to generically herein as the "housing floor" 100. The back side of the die is typically an electrical ground that communicates both electrically and thermally with the housing floor, which provides a thermal path from the dies to chassis rails or to some other heat destination. The housing floor may, for example, be an aluminum or copper panel, and may be nickel or gold plated.

Direct links to the wirebond interconnection points 110 on the tops of the dies 104, 106 are then formed by wirebonding, typically one at a time. High speed interconnections are formed by very short, direct wirebond interconnections 108 between adjacent upper edges of the dies 104, 106, while power, ground, and slower speed signaling connections, such as control, status, and clock signaling connections, are formed by longer wirebonds 114 that extend to transmission lines 117 or DC feedthrough connectors 115.

By excluding die packaging, and instead forming connections directly to and between the dies, the footprint of a chip-and-wire circuit assembly is greatly reduced. Furthermore, the reduced interconnection path lengths between connection points along adjacent edges of the dies improves high frequency processing by reducing interconnection inductances and speed-of-light signal transit delays. A further advantage is that the housing floor can be configured to efficiently draw heat away from the backs of the dies, which are the regions of greatest heat generation.

Wirebonding and chip-and-wire circuit assemblies have become well established and well-proven technologies. However, there is a significant cost associated with the manufacturing step of applying the wirebonds to the circuits. Also, as noted above, the requirement to locate interconnection points only about the perimeter of a die can limit the number of interconnections, and/or inflate the footprint of the die.

More recently, a new technology has been adopted for many applications that is generally referred to as the "flip-chip." According to this approach, with reference to FIGS. 1C and 1D, very small "bumps" 118 of solder are formed on the interconnection points, i.e. the IC pads, on the tops of the flip-chip dies 120 during the final wafer processing step, before the individual dies 120 are cut from the wafer. These solder bumps 118 are not limited to only the periphery of the flip-chip die, but can be provided as a flip-chip interconnection array 130 that takes advantage of most of the footprint of the die 120.

After the flip-chip dies 120 are cut from the wafer, each of the dies 120 is "flipped" so that its solder bumps 118 are facing downward. With reference to FIGS. 1E and 1F, the die 120 is then positioned so that its interconnection points 118 are aligned with a corresponding array 132 of solder bump connection pads 124 provided by the package or, in the case of a high-density circuit assembly 102, on a conventional, printed circuit motherboard 101. The solder bumps 118 are then re-flowed by any of several known heating methods, such that all of the required interconnections to the motherboard 101 are formed simultaneously. High frequency operation is enabled by locating high speed interconnection points along peripheral edges of the flip-chip interconnection arrays 130 so that very short conducting horizontal interconnection traces 126 can be provided on the motherboard 101 directly between solder bump connection pads 124 of adjacent dies 120, 122.

Manufacturing costs can be reduced by this flip-chip approach, compared to wirebonding approaches, due to the simultaneous forming of the interconnections, especially when applied in lieu of chip-and-wire for multi-die circuit assemblies.

As technology advances, it is frequently desirable to upgrade existing circuit assemblies by incorporating new die designs. One approach is to completely re-design a circuit assembly, for example by replacing all of the wirebond dies with newer, higher resolution and higher performance flip-chip dies and mounting the new flip-chip dies on a newly designed motherboard. However, the cost to design and fabricate a complete, new set of replacement flip-chip dies, as well as the increased testing costs to ensure that the new circuit assembly is durable and reliable, can be excessive.

Instead, with reference to FIG. 1F, it can be desirable to retain as much as possible of an existing, well proven chip-and-wire design 102, including the dies that are used and their layout and interconnections, while replacing only the die or dies that will most benefit from an upgrade, with corresponding modifications only to the affected portions of the housing floor 100. For example, it may be desirable to create a new circuit assembly 102' by replacing only one of the dies, or a single group of dies, with a single newer die 120 having an improved performance, while retaining the remainder of the well proven circuit assembly 102. Optimally, instead of designing and producing a new, modern die having an improved design, an existing and well-proven die 120 of a newer design can be selected and implemented in place of the older die or dies, thereby avoiding the cost of designing, fabricating, and testing a new die. However, if a newer die 120 with higher performance does exist, it will likely be a flip-chip die, and will therefore not be compatible for inclusion in a chip-and-wire circuit assembly 102', in that the solder bumps 118 of a flip-chip die are incompatible with wirebonding.

What is needed, therefore, is an improved apparatus and method for implementing a flip-chip die in a wirebonded chip-and-wire circuit assembly.

SUMMARY

The present disclosure is an apparatus and method for implementing a flip-chip die in a wirebonded chip-and-wire circuit assembly that increases the density of the circuit assembly and improves its high frequency performance. According to the present disclosure, an "interposer" is provided that adapts a flip-chip die for direct wirebond interconnection with surrounding wirebond dies. In embodiments, the interposer also enables interconnection between the flip-chip die and connection pads provided on an underlying motherboard. Some of these embodiments significantly increase the number of interconnections that can be made to the flip-chip die.

The disclosed interposer is a relatively small, flat element that includes an insulating substrate having a central region on its top surface on which an interposer interconnection array of connection pads is provided comprising a plurality of solder bump connection pads in an arrangement that is compatible with the flip-chip interconnection array of a flip-chip die. The interposer can be formed from an organic substrate, or from other insulating materials as are known in the art. At least some of the solder bump connection pads in the interposer interconnection array are connected by conducting horizontal traces to wirebond pads provided on the top of the interposer along at least one edge that extends beyond the flip-chip die, and is thereby accessible from above. In embodiments, most or all of these wirebond pad connections are to solder bumps that are located along one or more edges of the flip-chip interconnection array.

When the flip-chip die is attached to the interposer interconnection array and the interposer is bonded to the housing floor of the chip-and-wire circuit assembly, high speed communication can be provided between the flip-chip die and an adjacent wirebond die by forming wirebond connections between the wirebond pads on the edge of the interposer and wirebond interconnection points along the upper edge of the adjacent wirebond die.

In other embodiments, a motherboard is bonded to the underside of the housing floor, and an opening is provided in the housing floor immediately beneath the interposer, so that the interposer is mounted to the underlying motherboard rather than to the housing floor. In some of these embodiments, the interposer includes interconnections through interposer traces and vias to motherboard connection pads, referred to herein generically as surface mount technology pads or "SMT" pads, that are provided on the bottom side of the interposer and connect to attachment pads on the motherboard. It will be understood that the term SMT pad is used generically herein to refer to any connection pad provided on the bottom side of the interposer, and is not limited to any specific configuration of connection pad. In embodiments, this approach greatly increases the number of interconnections that can be formed with the flip-chip die, especially when the interposer is a multi-layer interposer that can form almost any desired combination of interconnections between the solder bump connection pads on the top surface of the interposer and the SMT pads on its bottom surface. Furthermore, the SMT pads need not extend beyond the flip-chip die, but can be located anywhere under the interposer, including beneath the flip-chip die itself. Accordingly, it is not necessary to allocate space on the motherboard for wirebond attachment pads near the interposer.

In some embodiments, the thickness of the interposer substrate is less than the height of adjacent wirebond dies, thereby reducing the degree by which the flip-chip die extends higher than the wirebond dies. In other embodiments, the thickness of the interposer substrate is substantially equal to the height of the adjacent wirebond dies, thereby minimizing the lengths of the edge-to-edge wirebond interconnections between the dies, while raising the flip-chip die higher relative to the wirebond dies.

Various embodiments take advantage of the added height of the top of the flip-chip die by applying a heat absorbing plate or heat sink to the top of the flip-chip die. In some of these embodiments that include more than one flip-chip die with interposer, a single cooling plate can be applied in contact with the tops of a plurality of the flip-chip dies.

In various embodiments, additional "support" components can be provided on the interposer proximate the flip-chip die, such as decoupling capacitors, clock terminations, baluns, and such like, thereby further shrinking the footprint of the circuit assembly.

The interposer is required to extend beyond the flip-chip die on at least one side, so that there is space on the top of the interposer to locate one or more wirebond pads. Various embodiments take advantage of this extension by including an "overhang" about part or all of the periphery of the interposer. This allows support components such as decoupling capacitors to be mounted to overhand attachment pads provided on the underside of the overhang, so that the support components hang upside-down from the overhang and above the motherboard, being located in some cases beneath wirebond pads located on the upper surface of the interposer.

A first general aspect of the present disclosure is an interposer configured for incorporating a flip-chip die into a chip-and-wire circuit assembly that includes a housing floor, the flip-chip die having a flip-chip interconnection array of solder bumps on an underside thereof the interposer includes an insulating substrate having an upper surface and a lower surface, an interposer interconnection array of solder bump connection pads located within a central region of the upper surface of the insulating substrate, and configured for direct interconnection with the flip-chip interconnection array, a wirebond pad located on the upper surface of the insulating substrate outside of the central region and proximate a peripheral edge of the insulating substrate, the wirebond pad being configured for wirebond interconnection with a wirebond die located adjacent to the interposer, and a first conducting horizontal trace applied to the upper surface of the interposer and extending to form an electrical interconnection between the wirebond pad and a first of the solder bump connection pads of the interposer interconnection array.

In embodiments, the lower surface of the insulating substrate is configured for direct bonding to the housing floor of the chip-and-wire circuit assembly. Or, the lower surface of the insulating substrate can be configured for insertion through an opening provided in the housing floor and for attachment to a motherboard that underlies the housing floor. In some of these embodiments, the interposer further comprises an SMT pad provided on the lower surface of the interposer and configure for direct attachment to an electrical attachment pad on an upper surface of the motherboard, and an interconnection path forming an electrical interconnection between the SMT pad and a second of the solder bump connection pads of the interposer interconnection array. And in any of these embodiments, the interposer can include at least three interconnection layers, the upper surface of the interposer being a first of the interconnection layers, an internal layer of the interposer being a second of the interconnection layers, and the lower surface of the interposer being a last of the interconnection layers.

In any of the above embodiments, the upper surface of the insulating substrate can extend beyond the lower surface of the insulating substrate along at least one side of the interposer, thereby creating an overhang, an edge cavity being created below the overhang, a plurality of overhang connection pads for attachment thereto of at least one support component being provided on an under surface of the overhang.

A second general aspect of the present disclosure is a hybrid circuit assembly that includes a housing having a housing floor, a wirebond die having a lower surface bonded to the housing floor and an upper surface comprising a wirebond interconnection point proximate an upper edge of the wirebond die, an interposer according to any embodiment of the first general aspect, the interposer being attached to the hybrid circuit assembly proximate the wirebond die, such that the wirebond pad of the interposer is proximate the interconnection point of the wirebond die, and a wirebond extending between the wirebond pad of the interposer and the wirebond interconnection point of the wirebond die, the wirebond having a first end welded to the wirebond interconnection point of the wirebond die and a second end welded to the wirebond pad of the interposer.

In embodiments, a thickness of the insulating substrate of the interposer is substantially equal to a thickness of the wirebond die, thereby placing the wirebond pad of the interposer at a height above the motherboard that is substantially equal to a height above the motherboard of the wirebond interconnection point of the wirebond die.

In any of the above embodiments, an upper surface of the flip-chip die can extend further above the motherboard than the wirebond interconnection point of the wirebond die, and the hybrid circuit assembly can further include a heat absorbing plate applied to the upper surface of the flip-chip die.

In any of the above embodiments, the lower surface of the insulating substrate can be directly bonded to the housing floor of the chip-and-wire circuit assembly. Or, the lower surface of the insulating substrate can be inserted through an opening provided in the housing floor and attached to a motherboard that underlies the housing floor. In some of these embodiments the interposer further includes an SMT pad provided on the lower surface of the insulating substrate of the interposer and directly attached to an attachment pad on an upper surface of the motherboard, and an interconnection path forming an electrical interconnection between the motherboard attachment pad and a second of the solder bump connection pads of the interposer interconnection array. And in any of these embodiments, the interposer can include at least three interconnection layers, the upper surface of the interposer being a first of the interconnection layers, an internal layer of the interposer being a second of the interconnection layers, and the lower surface of the insulating substrate of the interposer being a last of the interconnection layers.

In any of the above embodiments, the upper surface of the insulating substrate can extend beyond the lower surface of the insulating substrate along at least one side of the interposer, thereby creating an overhang, an edge cavity being created beneath the overhang; a plurality of overhang connection pads can be provided on an under surface of the overhang, a first of the overhang connection pads being interconnected with a third of the solder bump connection pads of the interposer interconnection array, and the hybrid circuit assembly can further include a support component located within the edge cavity and attached to the plurality of overhang connection pads. In some of these embodiments the support component is at least partially located beneath the wirebond connection pad on the upper surface of the interposer insulating substrate.

A third general aspect of the present disclosure is a method of incorporating a flip-chip die into a chip-and-wire circuit assembly, the flip-chip having a flip-chip interconnection array of solder bump connection pads on an underside thereof. The method includes providing an interposer according to any embodiment of the first general aspect, placing the flip-chip onto the upper surface of the interposer substrate such that the flip-chip interconnection array is aligned with the interposer interconnection, heating the flip-chip and interposer interconnection arrays of solder bump connection pads until they melt and form interconnections with each other, the wirebond pad of the interposer being thereby interconnected with a first of the solder bump connection pads of the flip-chip interconnection array, providing an attachment area in the chip-and-wire circuit assembly that is adjacent to a wirebond die that is bonded to a housing floor of the chip-and-wire circuit assembly, bonding the lower surface of the interposer insulating substrate to the attachment area such that the wirebond pad of the interposer substrate is proximate a wirebond interconnection point of the wirebond die, and forming a wirebond connection between the wirebond pad of the interposer and the wirebond interconnection point of the wirebond die by welding a first end of a wirebond to the wirebond interconnection point of the wirebond die and welding a second end of the wirebond to the wirebond pad of the interposer.

In embodiments, bonding the lower surface of the insulating substrate to the attachment area includes bonding the lower surface of the insulating substrate directly to the housing floor of the chip-and-wire circuit assembly. Or, bonding the lower surface of the insulating substrate to the attachment area includes inserting the lower surface of the interposer insulating substrate through an opening provided in the housing floor and attaching it to a motherboard that underlies the housing floor. In some of these embodiments, the interposer further comprises an SMT pad provided on the lower surface of the interposer insulating substrate, and an interconnection path forming an electrical interconnection between the SMT pad and a second of the solder bump connection pads of the interposer interconnection array, the motherboard comprises an attachment pad on its upper surface within the attachment area, and attaching the lower surface of the interposer insulating substrate to the motherboard further comprises forming an electrical connection between the motherboard SMT pad of the interposer and the attachment pad of the motherboard.

In any of the above embodiments, an upper surface of the flip-chip die can extend further above the motherboard than the wirebond interconnection point of the wirebond die, and the method can further include applying a heat absorbing plate to the upper surface of the flip-chip die.

In any of the above embodiments, the upper surface of the insulating substrate can extend beyond the lower surface of the insulating substrate along at least one side of the interposer, thereby creating an overhang, an edge cavity being created beneath the overhang, a plurality of overhang connection pads can be provided on an under surface of the overhang, a first of the overhang connection pads being interconnected with a third of the solder bump connection pads of the interposer interconnection array, and the method can further include locating a support component within the edge cavity and attaching the support component to the overhang connection pads. In some of these embodiments, the support component is at least partially located beneath the wirebond connection pad on the upper surface of the insulating substrate.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1A:
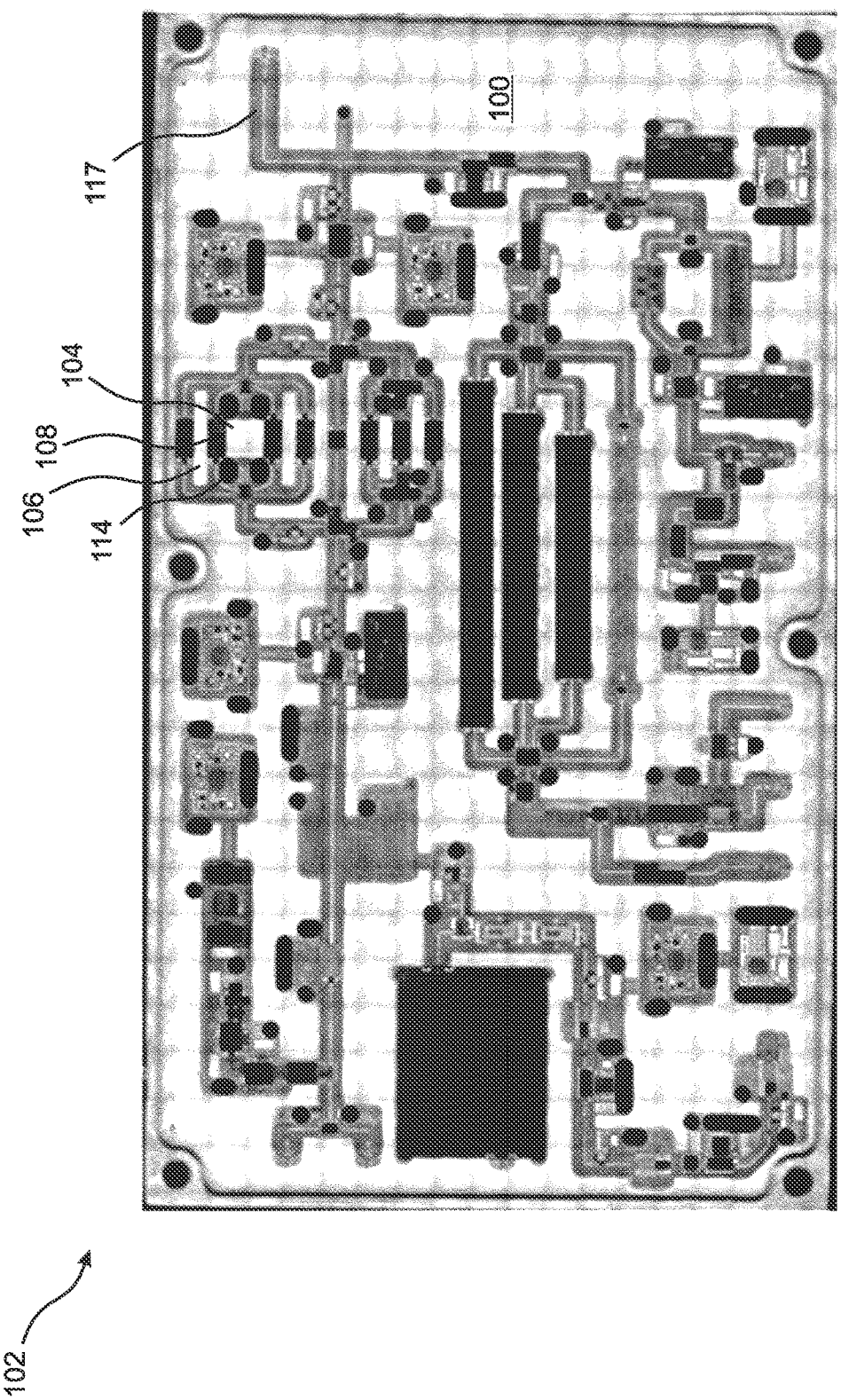
FIG. 1A is a view from above of a chip-and-wire circuit assembly of the prior art.
Figure 1B:
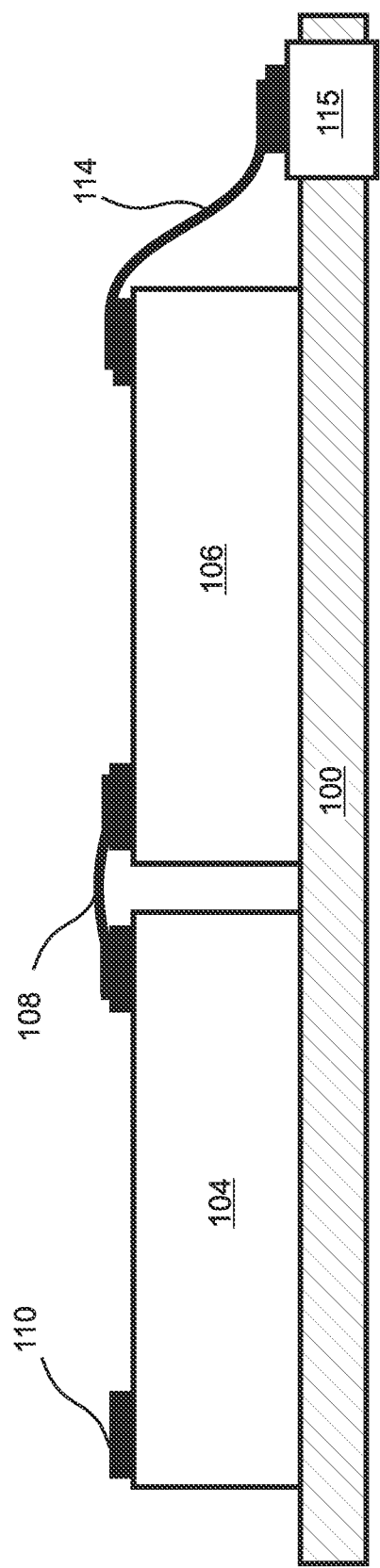
FIG. 1B is a simplified side view of two interconnected wirebond dies of a chip-and-wire circuit assembly of the prior art.
Figure 1C:
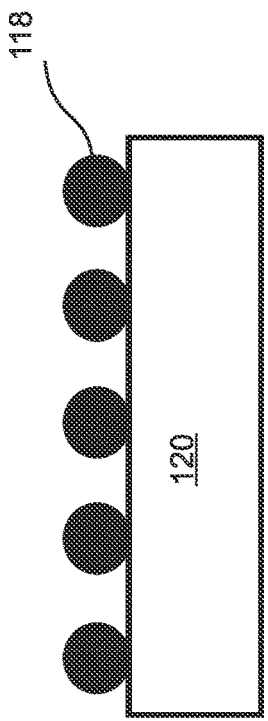
FIG. 1C is a perspective view from above of a flip-chip interconnection array of a flip-chip of the prior art.
Figure 1D:
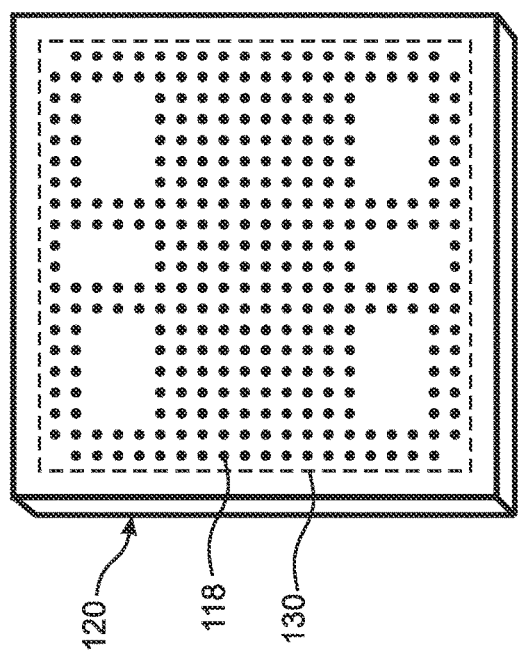
FIG. 1D is a side view of a flip-chip of the prior art.
Figure 1E:
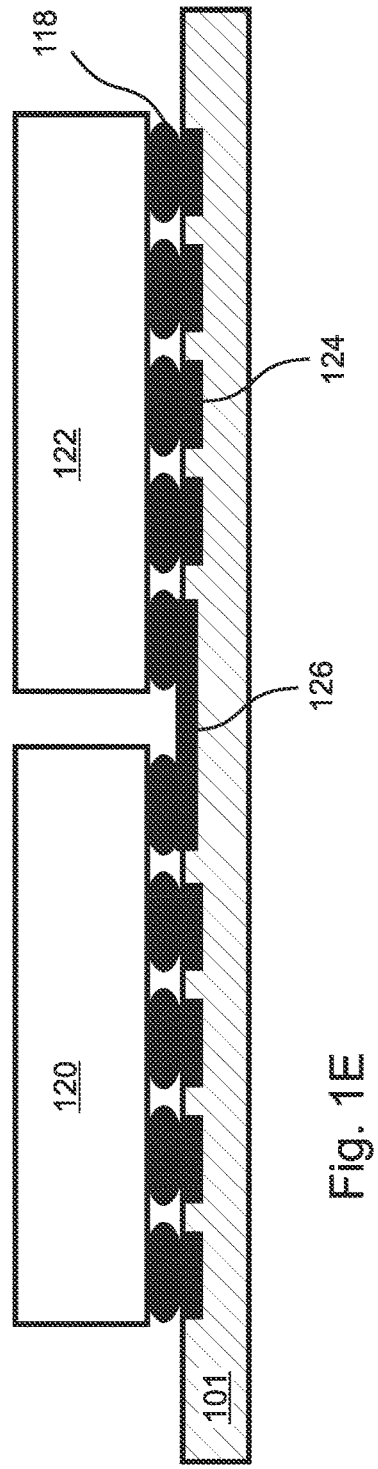
FIG. 1E is a side view illustrating interconnection of two flip-chip dies in a flip-chip circuit assembly of the prior art.
Figure 1F:
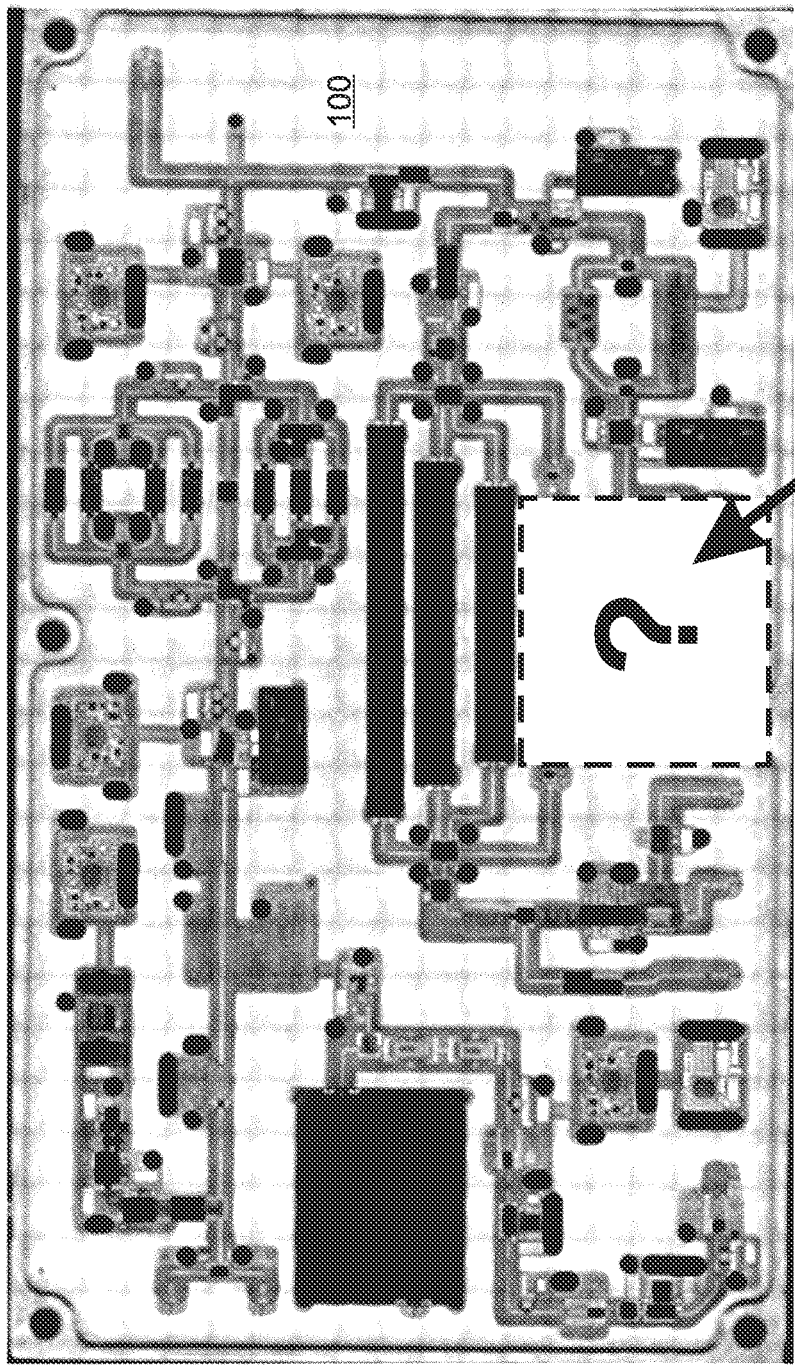
FIG. 1F illustrates direct attachment of a flip-chip die and motherboard to the housing floor of the wirebond circuit assembly of FIG. 1A.
Figure 1F:
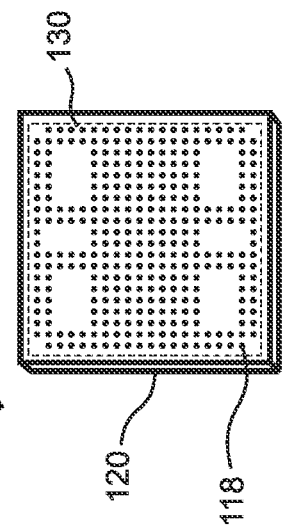
Figure 2A:
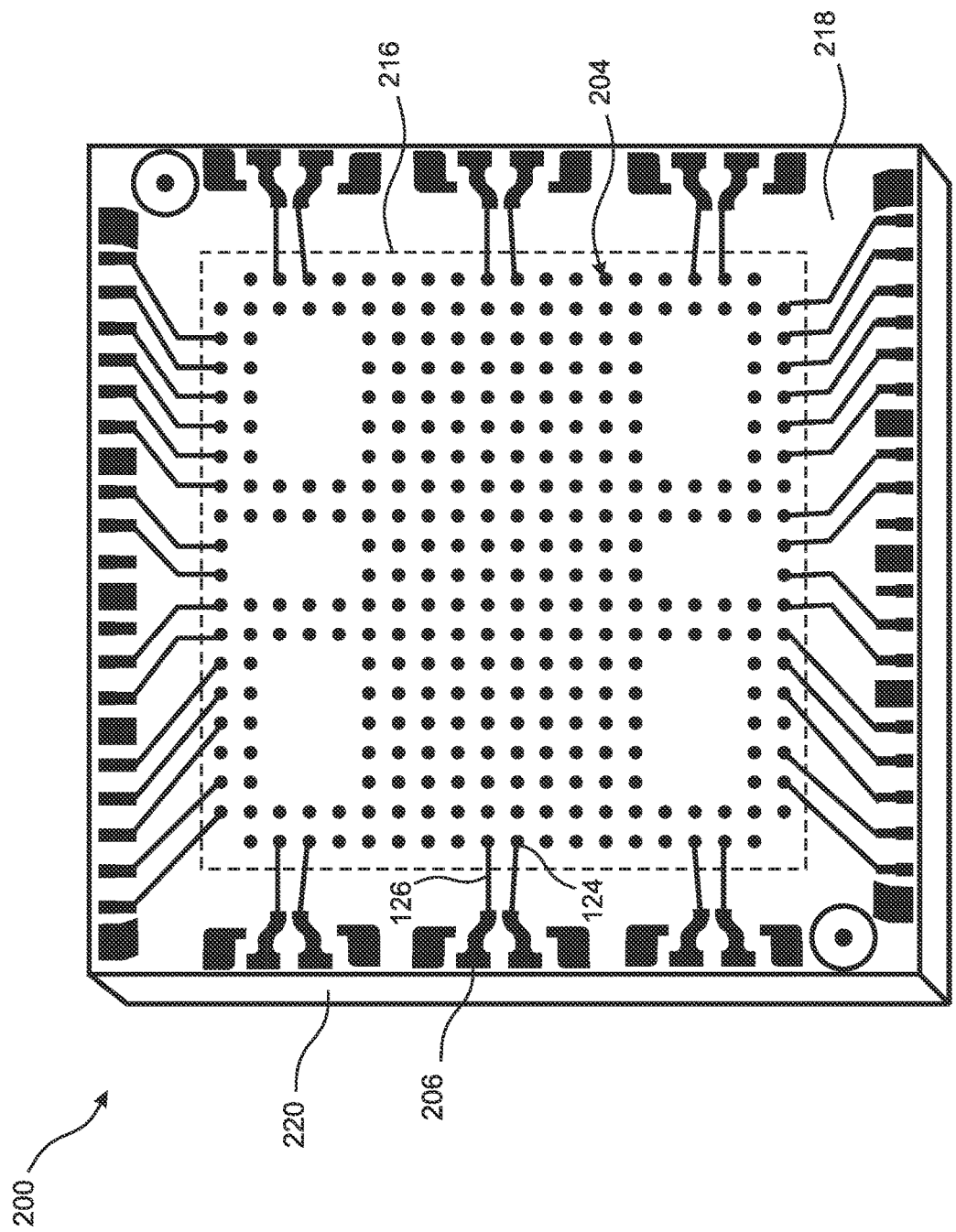
FIG. 2A is a perspective view from above of an interposer according to an embodiment of the present disclosure.
Figure 2B:
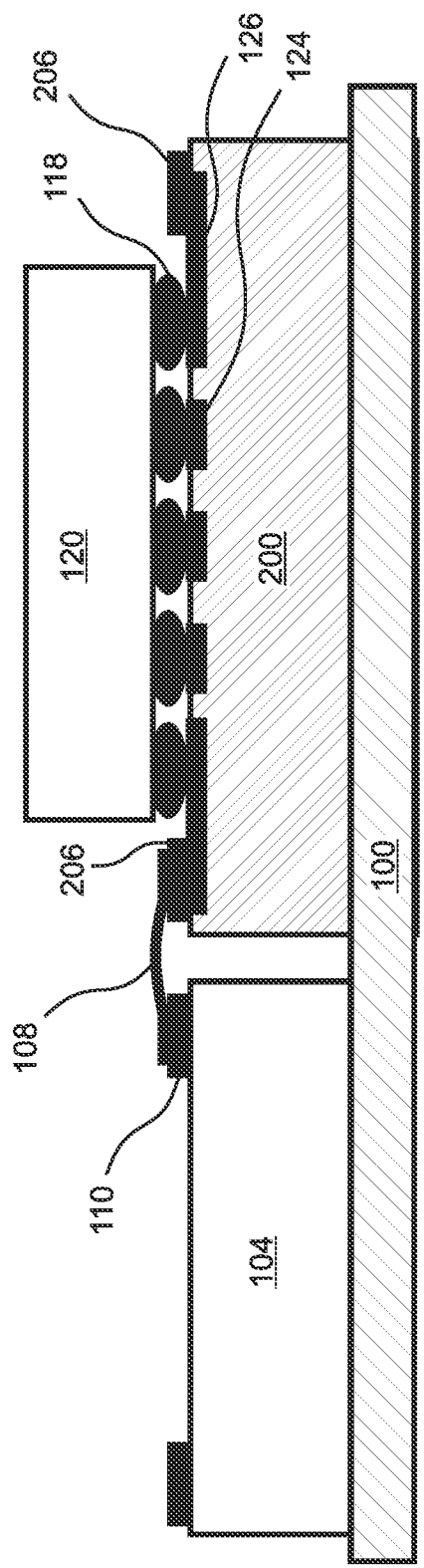
FIG. 2B is a cross-sectional view from the side of a flip-chip die interconnected with an adjacent wirebond die via an interposer according to an embodiment of the present disclosure.
Figure 2C:
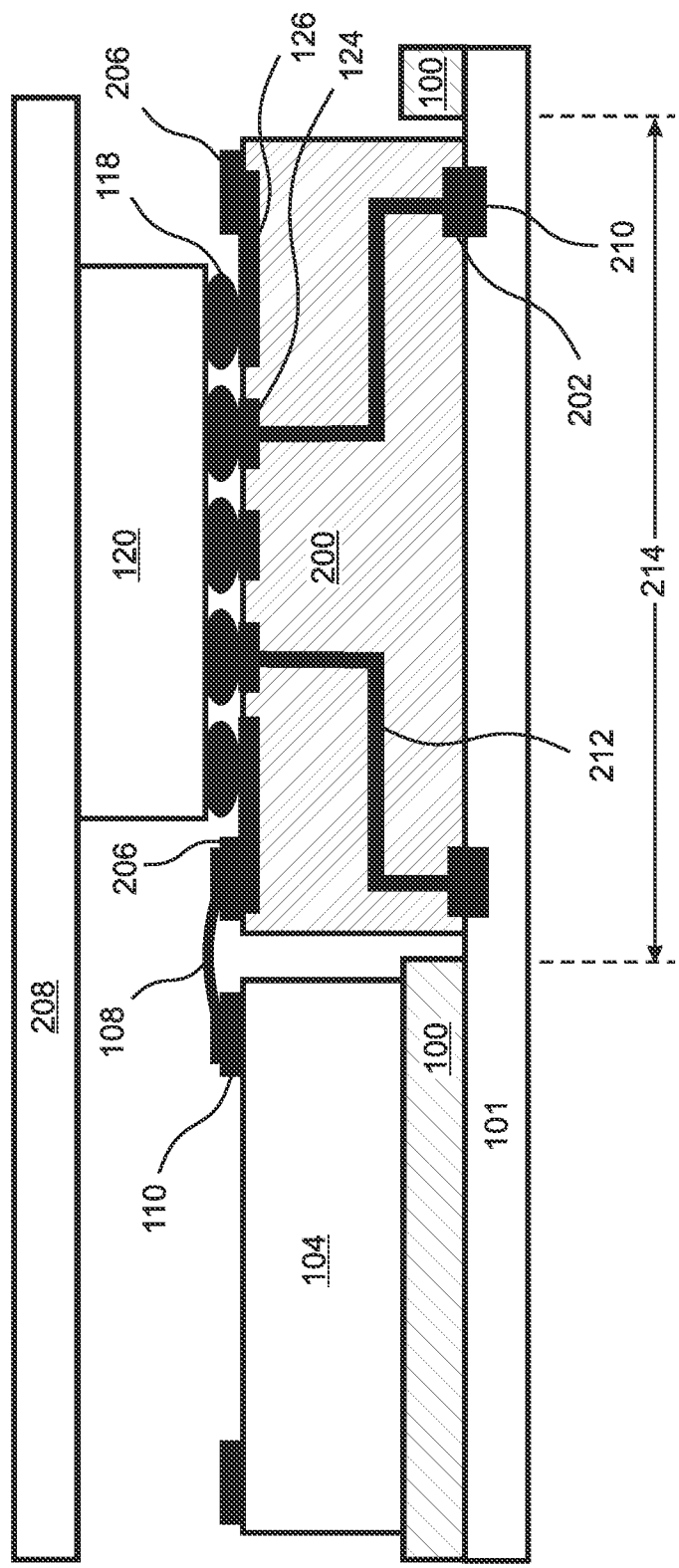
FIG. 2C is a cross-sectional side view similar to FIG. 2B but including a motherboard bonded to the outer side of the housing floor, and a heat-absorbing plate applied to the upper surface of the flip-chip.

The present disclosure is an apparatus and method for implementing a flip-chip die in a wirebonded chip-and-wire circuit assembly that increases the density of the circuit assembly and improves its high frequency performance. With reference to FIGS. 2A through 2C, an "interposer" 200 is provided that adapts a flip-chip die 120 for direct wirebonding with surrounding wirebond dies 104. In some embodiments, as illustrated in FIG. 2B, the interposer is directly bonded to the housing floor 100 of the chip-and-wire circuit assembly, while in other embodiments, as illustrated in FIG. 2C, a motherboard 101 is bonded to an underside of the housing floor 100, and an opening 214 is provided in the housing floor 100 that enables the interposer 200 to be mounted to the motherboard 101. In some of these embodiments, the interposer 200 enables interconnection between the flip-chip die 120 and attachment pads 210 provided on the motherboard 101 via connection pads 202, referred to herein generically as SMT pads, provided on the underside of the interposer 200. Various embodiments significantly increase the number of interconnections that can be made to the flip-chip die 120.

The disclosed interposer 200 is a relatively small, flat element that includes an insulating substrate 220 having a central region 216 on its top surface 218 on which an interposer interconnection array 204 is provided comprising a plurality of solder bump connection pads 124 in an arrangement that is compatible with the flip-chip interconnection array 130 of a flip-chip die 120. At least some of the solder bump connection pads 124 in the interposer interconnection array 204 are connected by conducting horizontal traces 126 to wirebond pads 206 provided on at least one edge of the interposer 200 that extends beyond the flip-chip die and is thereby accessible from above. In embodiments, most or all of these wirebond pads 206 are connected by traces 126 to solder bump connection pads 124 that are located along one or more edges of the flip-chip interconnection array 204.

When the flip-chip die 120 is attached to the interposer interconnection array 204 and the interposer 200 is mounted to the housing floor 100 or to an underlying motherboard 101, for example by surface mount technology (SMT), high speed communication can be provided between the flip-chip die 120 and an adjacent wirebond die 104 by forming wirebond connections between the wirebond pads 206 on the edge of the interposer 200 and wirebond interconnection points 110 along the upper edge of the adjacent wirebond die 104.

In some embodiments, the thickness of the interposer 200 is less than the height of adjacent wirebond dies 104, thereby reducing the degree by which the flip-chip die 120 extends higher than the wirebond dies 104. In the embodiment of FIG. 2B, the thickness of the interposer 200 is substantially equal to the height of the adjacent wirebond die 104, thereby minimizing the lengths of the edge-to-edge wirebond interconnections 108, 126 between the dies 104, 120, while raising the flip-chip die 120 higher relative to the wirebond die 104.

With reference to FIG. 2C, an interposer 200 that is mounted to an underlying motherboard 101 can also include interconnections to attachment pads 210 of the motherboard 101 through traces 212 and vias that provide communication between the flip chip die 120 and SMT pads 202 that are provided on the bottom of the interposer 200. In embodiments, this approach greatly increases the number of interconnections that can be formed with the flip-chip die 120, especially when the interposer 200 is a multi-layer interposer 200 that can form almost any desired combination of interconnections between the solider bump connection pads 124 on the top surface of the interposer 200 and the SMT pads 202 on its bottom surface.

The embodiment of FIG. 2C takes advantage of the added height of the top of the flip-chip die 120 by applying a heat absorbing plate 208 or heat sink to the top of the flip-chip die 120. In some of these embodiments that include more than one flip-chip die 120 with interposer 200, a single cooling plate 208 can be applied in contact with the tops of a plurality of the flip-chip dies 120.

In various embodiments, additional "support" components can be provided on the interposer proximate the flip-chip die, such as decoupling capacitors, clock terminations, baluns, and such like, thereby further shrinking the footprint of the circuit assembly.

Figure 3:
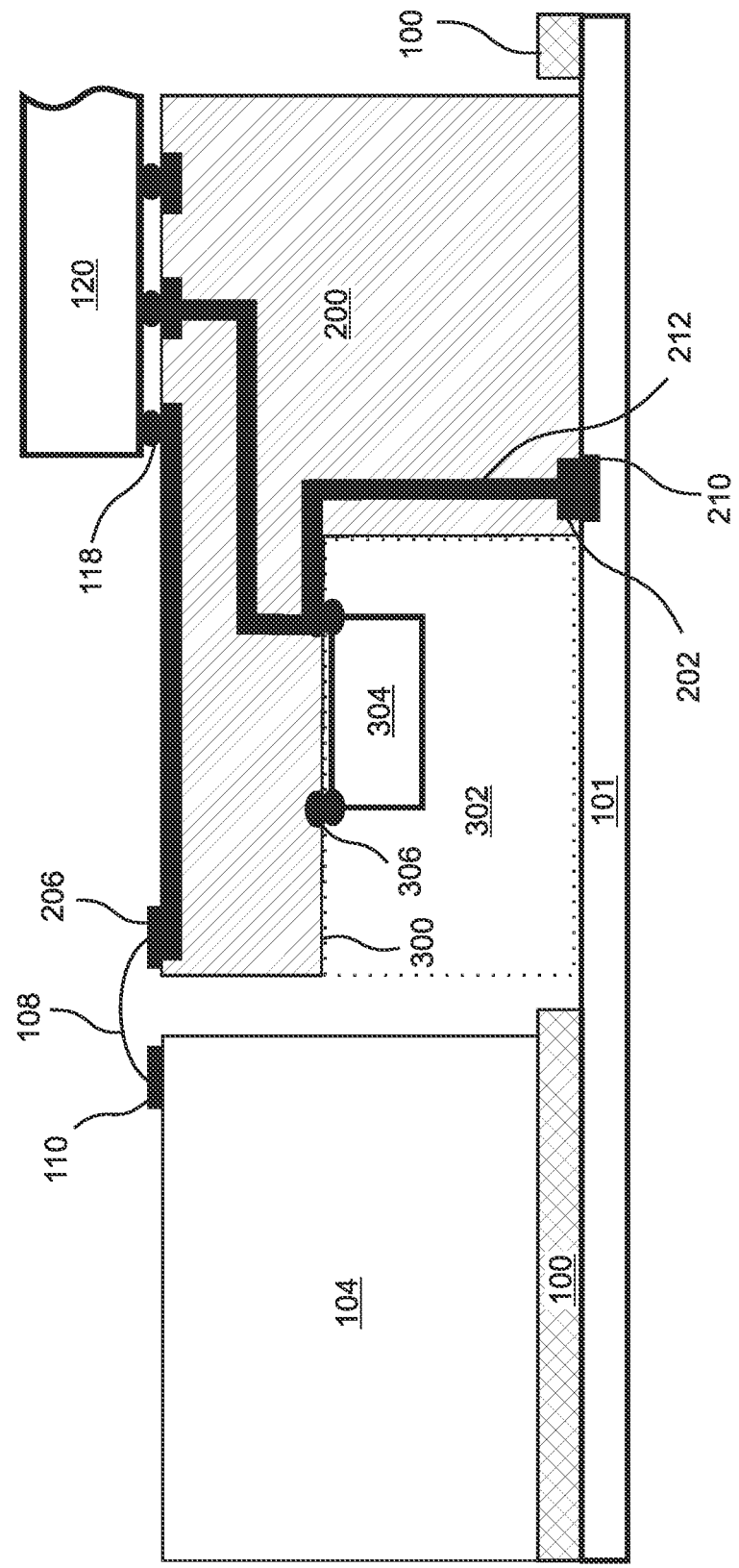
FIG. 3 is a cross-sectional view from the side of a simplified embodiment of the present disclosure that includes a multi-layer interposer having an overhang that forms an edge cavity within which a support component is mounted.

As can be seen in FIGS. 2B and 2C, the interposer 200 is required to extend beyond the flip-chip die 120 on at least one side, so that there is space on the top of the interposer 200 to locate one or more wirebond pads 206. With reference to FIG. 3, embodiments take advantage of this extension of the interposer 200 beyond the flip-chip die 120 by including an "overhang" 300 about part or all of the periphery of the interposer 200. This creates an "edge cavity" 302 between the overhang 300 and the housing floor 100 or the underlying motherboard 101, which allows capacitors and other support components 304 to be mounted to overhang connection pads 306 on the underside of the overhang 300, so that the support components 304 hang upside-down from the overhang 300 within the edge cavity 302. In embodiments, the edge cavity 302 extends beneath wirebond pads 206 located on the upper surface of the interposer 200.

In summary, in embodiments the disclosed interposer 200 combines surface mount technology (SMT), as provided by the SMT pads 202 on its bottom side, with chip-and-wire (wirebond) technology, as provided by the wirebond pads 206 on its upper side, thereby combining two different circuit assembly approaches that both have significate heritage and proven reliability. The disclosed interposer 200 can include layer counts greater than 2, thereby enhancing the interconnection "breakout" of the flip-chip die 120. In embodiments, high speed "RF" performance is optimized by presenting the high frequency RF interconnection wirebond pads 206 on the top peripheral edge of the interposer 200, where they can be directly wirebonded to the wirebond connection points 110 of adjacent wirebond dies 104, while the lower speed control, power, and status signals can be easily distributed to the bottom of the interposer and interconnected via the SMT pads 202 with attachment pads 210 provided on the motherboard 101.

Figure 4:
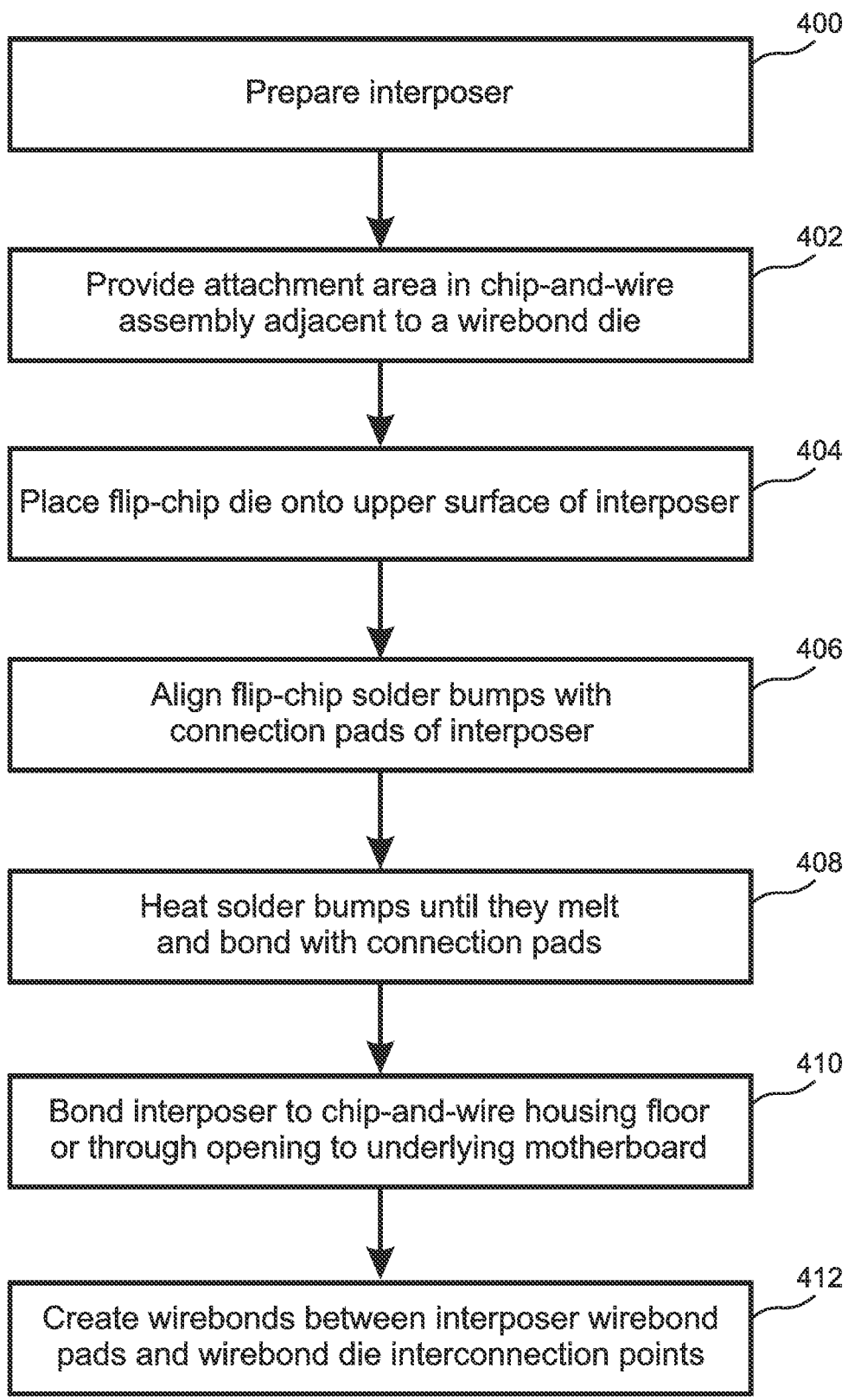
FIG. 4 is a flow diagram that illustrates a method embodiment of the present disclosure.

With reference to FIG. 4, a method embodiment of the present disclosure includes preparing 400 an interposer 200 and providing 402 an attachment area in a chip-and-wire assembly 102 that is adjacent to a wirebond die 104. A flip-chip die 120 is placed 404 onto the upper surface of the interposer 200 and positioned 406 so that the solder bumps 118 of the interposer 200 align with the connection pads 124 of the interposer 200. The solder bumps 118 are heated 408 until they melt and bond with the connection pads 124. The assembled flip-chip die 120 and interposer 200 are then bonded 410 either to the housing floor 100 of the chip-and-wire assembly 102 or through an opening in the housing floor 100 to an underlying motherboard 101. Wirebonds 108 are then created 412 between the wirebond pads 206 of the interposer 200 and the wirebond interconnection points 110 of the wirebond die 104.

The foregoing description of the embodiments of the disclosure has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the disclosure to the precise form disclosed. Many modifications and variations are possible in light of this disclosure.

Although the present application is shown in a limited number of forms, the scope of the disclosure is not limited to just these forms, but is amenable to various changes and modifications. The disclosure presented herein does not explicitly disclose all possible combinations of features that fall within the scope of the disclosure. The features disclosed herein for the various embodiments can generally be interchanged and combined into any combinations that are not self-contradictory without departing from the scope of the disclosure. In particular, the limitations presented in dependent claims below can be combined with their corresponding independent claims in any number and in any order without departing from the scope of this disclosure, unless the dependent claims are logically incompatible with each other.

What is claimed is:

1. An interposer configured for incorporating a flip-chip die into a chip-and-wire circuit assembly that includes a housing floor, the flip-chip die having a flip-chip interconnection array of solder bumps on an underside thereof, the interposer comprising:
    an insulating substrate having an upper surface and a lower surface;
    an interposer interconnection array of solder bump connection pads located within a central region of the upper surface of the insulating substrate, and configured for direct interconnection with the flip-chip interconnection array;
    a wirebond pad located on the upper surface of the insulating substrate outside of the central region and proximate a peripheral edge of the insulating substrate, the wirebond pad being configured for wirebond interconnection with a wirebond die located adjacent to the interposer; and
    a first conducting horizontal trace applied to the upper surface of the interposer and extending to form an electrical interconnection between the wirebond pad and a first of the solder bump connection pads of the interposer interconnection array;
    wherein the upper surface of the insulating substrate extends beyond the lower surface of the insulating substrate along at least one side of the interposer, thereby creating an overhang, an edge cavity being created below the overhang, a plurality of overhang connection pads for attachment thereto of at least one support component being provided on an under surface of the overhang.

2. The interposer of claim 1, wherein the lower surface of the insulating substrate is configured for direct bonding to the housing floor of the chip-and-wire circuit assembly.

3. The interposer of claim 1, wherein the lower surface of the insulating substrate includes an opening in the housing floor and for attachment to a motherboard that underlies the housing floor.

4. The interposer of claim 3, wherein the interposer further comprises:
    a surface mount technology ("SMT") pad provided on the lower surface of the insulating substrate and configured for direct attachment to an electrical attachment pad on an upper surface of the motherboard; and an interconnection path forming an electrical interconnection between the SM T pad and a second of the solder bump connection pads of the interposer interconnection array.

5. The interposer of claim 3, wherein the interposer comprises at least three interconnection layers, the upper surface of the interposer being a first of the interconnection layers, an internal layer of the interposer being a second of the interconnection layers, and the lower surface of the insulating substrate being a last of the interconnection layers.

6. A hybrid circuit assembly comprising:
a housing having a housing floor;
a wirebond die having a lower surface bonded to the housing floor and an upper surface comprising a wirebond interconnection point proximate an upper edge of the wirebond die;
an interposer comprising:
an insulating substrate having an upper surface and a lower surface;
an interposer interconnection array of solder bump connection pads located within a central region of the upper surface of the insulating substrate, and configured for direct interconnection with a flip-chip interconnection array;
a wirebond pad located on the upper surface of the insulating substrate outside of the central region and proximate a peripheral edge of the insulating substrate, the wirebond pad being configured for wirebond interconnection with the wirebond die and located adjacent to the interposer; and
a first conducting horizontal trace applied to the upper surface of the interposer and extending to form an electrical interconnection between the wirebond pad and a first of the solder bump connection pads of the interposer interconnection array;
wherein the interposer is attached to the hybrid circuit assembly proximate the wirebond die, such that the wirebond pad of the interposer is proximate the interconnection point of the wirebond die;
wherein the lower surface of the insulating substrate of the interposer is directly bonded to the housing floor of the chip-and-wire circuit assembly;
wherein the lower surface of the insulating substrate of the interposer is inserted through an opening provided in the housing floor and attached to a motherboard that underlies the housing floor; and
a wirebond extending between the wirebond pad of the interposer and the wirebond interconnection point of the wirebond die, the wirebond having a first end welded to the wirebond interconnection point of the wirebond die and a second end welded to the wirebond pad of the interposer.

7. The hybrid circuit assembly of claim 6, wherein a thickness of the insulating substrate of the interposer is substantially equal to a thickness of the wirebond die, thereby placing the wirebond pad of the interposer at a height above a motherboard that is substantially equal to a height above the motherboard of the wirebond interconnection point of the wirebond die.

8. The hybrid circuit assembly of claim 6, wherein:
an upper surface of the flip-chip die extends further above a motherboard than the wirebond interconnection point of the wirebond die; and
the hybrid circuit assembly further comprises a heat absorbing plate applied to the upper surface of the flip-chip die.

9. The hybrid circuit assembly of claim 6, wherein the interposer further comprises:
a surface mount technology ("SMT") pad provided on the lower surface of the insulating substrate of the interposer and directly attached to an attachment pad on an upper surface of the motherboard; and
an interconnection path forming an electrical interconnection between the motherboard attachment pad and a second of the solder bump connection pads of the interposer interconnection array.

10. The hybrid circuit assembly of claim 6, wherein the interposer comprises at least three interconnection layers, the upper surface of the interposer being a first of the interconnection layers, an internal layer of the interposer being a second of the interconnection layers, and the lower surface of the insulating substrate of the interposer being a last of the interconnection layers.

11. The hybrid circuit assembly of claim 6, wherein:
the upper surface of the interposer extends beyond the lower surface of the insulating substrate of the interposer along at least one side of the interposer, thereby creating an overhang, an edge cavity being created beneath the overhang;
a plurality of overhang connection pads are provided on an under surface of the overhang, a first of the overhang connection pads being interconnected with a third of the solder bump connection pads of the interposer interconnection array; and
the hybrid circuit assembly further comprises a support component located within the edge cavity and attached to the plurality of overhang connection pads.

12. The hybrid circuit assembly of claim 11, wherein the support component is at least partially located beneath the wirebond connection pad on the upper surface of the interposer insulating substrate.

* * * * *